United States Patent
Kao (10) Patent No.: US 7,378,327 B2
(45) Date of Patent: May 27, 2008

(54) METHOD FOR FABRICATING A JUNCTION VARACTOR WITH HIGH Q FACTOR

(75) Inventor: Ching-Hung Kao, Hsin-Chu Hsien (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 11/760,789

(22) Filed: Jun. 10, 2007

(65) Prior Publication Data
US 2007/0232010 A1  Oct. 4, 2007

Related U.S. Application Data

(63) Continuation of application No. 10/711,140, filed on Aug. 27, 2004, now abandoned.

(51) Int. Cl.
*H01L 21/20* (2006.01)
(52) U.S. Cl. .............................. 438/379; 257/E29.344; 257/E27.049; 257/E21.364
(58) Field of Classification Search ............... 438/379; 257/E27.049, E21.364, E29.344
See application file for complete search history.

(56) References Cited

U.S. PATENT DOCUMENTS

| 6,127,700 | A  | * | 10/2000 | Bulucea ...................... 257/335 |
| 6,576,958 | B2 |   | 6/2003  | Ker et al. |
| 6,882,029 | B1 | * | 4/2005  | Gau et al. ................... 257/595 |
| 6,943,399 | B1 | * | 9/2005  | Gau ........................... 257/312 |
| 6,949,440 | B2 | * | 9/2005  | Gau ........................... 438/379 |
| 7,056,761 | B1 |   | 6/2006  | Vashchenko et al. |
| 7,259,418 | B2 | * | 8/2007  | Kadowaki et al. .......... 257/312 |
| 2002/0074589 | A1 | * | 6/2002 | Benaissa et al. ............ 257/312 |

FOREIGN PATENT DOCUMENTS

CN  1438705 A  8/2003

\* cited by examiner

*Primary Examiner*—Steven Loke
*Assistant Examiner*—Tram H Nguyen
(74) *Attorney, Agent, or Firm*—Winston Hsu (57) ABSTRACT

A junction varactor includes a gate finger lying across an ion well of a semiconductor substrate; a gate dielectric situated between the gate finger and the ion well; a first ion diffusion region with first conductivity type located in the ion well at one side of the gate finger, the first ion diffusion region serving as an anode of the junction varactor; and a second ion diffusion region with a second conductivity type located in the ion well at the other side of the gate finger, the second ion diffusion region serving as a cathode of the junction varactor. In operation, the gate of the junction varactor is biased to a gate voltage $V_G$ that is not equal to 0 volt.

8 Claims, 9 Drawing Sheets

METHOD FOR FABRICATING A JUNCTION VARACTOR WITH HIGH Q FACTOR

CROSS REFERENCE TO RELATED APPLICATIONS

This is a continuation application of U.S. patent application Ser. No. 10/711,140 filed Aug. 27, 2004.

BACKGROUND OF THE INVENTION

1. Field of the Invention

The present invention relates generally to a varactor, and more particularly, to a method for fabricating a PN-junction varactor having improved quality factor (Q factor).

2. Description of the Prior Art

A varactor is, essentially, a variable voltage capacitor. The capacitance of a varactor, when within its operating parameters, decreases as a voltage applied to the device increases. Such a device is useful in the design and construction of oscillator circuits now commonly used for, among other things, communications devices. Varactors are typically employed in voltage-controlled oscillators (VCOs) where a frequency of an oscillator is controlled by an applied current or voltage. In such instances, the VCOs are used when a variable frequency is required, or when a signal needs to be synchronized to a reference signal.

Numerous varactors have been developed and are employed in integrated circuit technologies, for example, PN-diodes, Schottky diodes or MOS-diodes as a varactor in bipolar, CMOS and BiCMOS technologies. Among these, two varactor structures are most frequently used: the PN-junction varactor and the MOS varactor. Currently the PN-junction varactor is predominantly used in LC oscillators. Both these structures can be implemented using standard CMOS processes.

Figure 1:
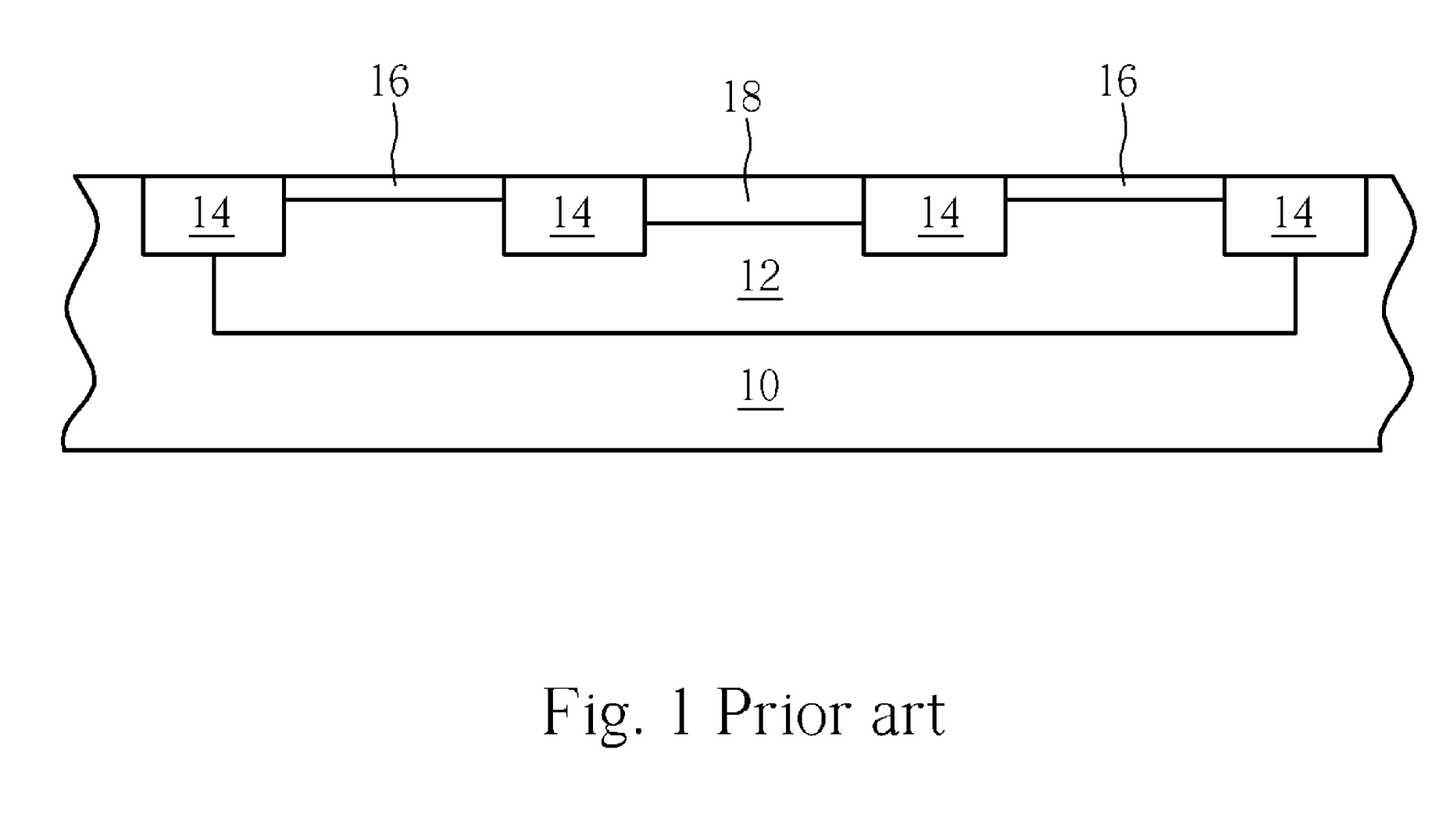
FIG. 1 is a cross-sectional schematic diagram illustrating a prior art PN junction varactor.

Referring to FIG. 1, a prior art PN diode varactor is illustrated in a cross-sectional view. As shown in FIG. 1, a substrate 10 includes an N-well 12, and a plurality of isolation structures 14, such as field oxide layer or shallow trench isolation (STI), on surfaces of the N-well 12 and the substrate 10. The isolation structures 14 define a plurality of predetermined regions on the N-well 12 to form at least an N-type doping region 16 and a P-type doping region 18, thus completing a diode structure having a PN junction. When the diode is reverse-biased, a depletion region occurs in the PN junction of the diode and acts as a dielectric, so that the N-type doping region 16 and the P-type doping region 18 separated by the dielectric form an equivalent capacitor. With an adjustment in the voltage across the anode (the P-type doping region 18) and the cathode (the N-type doping region 16) of the diode, a width of the depletion region varies to change the equivalent capacitance of the varactor.

Figure 2:
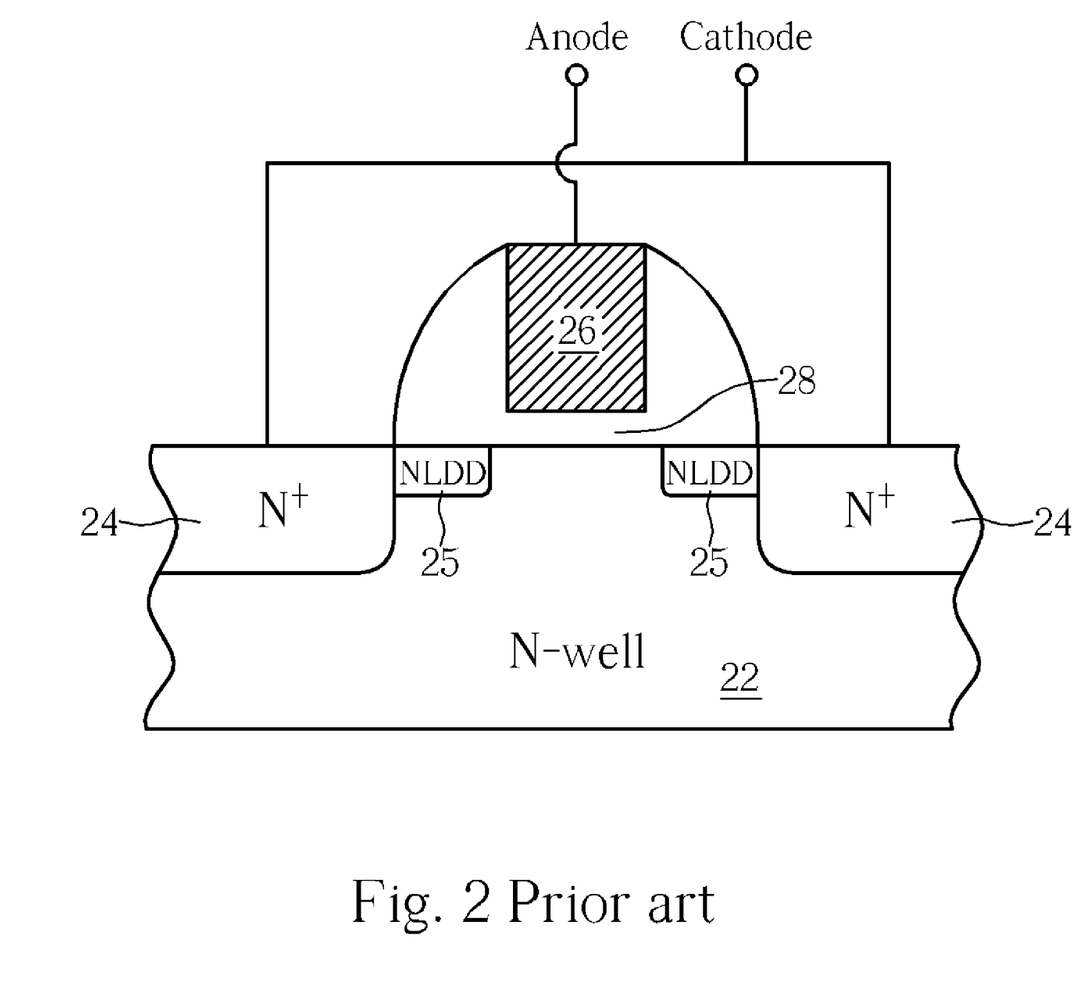
FIG. 2 is a cross-sectional schematic diagram illustrating a prior art MOS varactor.

Referring to FIG. 2, a prior art MOS varactor is illustrated in a cross-sectional view. The prior art MOS varactor is formed on an N-well 22. The prior art MOS varactor includes a polysilicon gate structure 26 serving as an anode of the MOS varactor, a gate oxide layer 28 between the gate structure 26 and the N-well 22, and two $N^+$ doped regions 24 on both sides of the gate structure 26, wherein the $N^+$ doped regions 24, which are implanted in the N-well 22, serve as a cathode of the MOS varactor. N type lightly doped drain regions 25 are also provided.

The main drawback of the prior art PN junction varactor as set forth in FIG. 1 is a low maximum to minimum capacitance ratio and small quality factor (Q factor). The MOS varactor does not suffer on this account, with a high maximum to minimum capacitance ratio of roughly four to one for a typical 0.25 μm CMOS process. Furthermore, the MOS varactor's ratio increases in deep submicron processes due to the thinner gate oxide used. However, the MOS varactor's transition from maximum to minimum capacitance is abrupt. This gives a MOS varactor a small, highly non-linear voltage control range.

SUMMARY OF THE INVENTION

It is therefore a primary object of the claimed invention to provide a varactor to improve the electrical performance thereof.

It is another object of the claimed invention to provide a CMOS-compatible method for fabricating a junction varactor having improved quality factor.

According to the claimed invention, a method for fabricating a junction varactor is disclosed. The method includes: providing a substrate having thereon an ion well of first conductivity type; forming first and second gate fingers across the ion well, wherein the first and second gate fingers are substantially parallel to one another; forming a central lightly doped region of a second conductivity type in the ion well between the first and second gate fingers; forming sideward lightly doped regions of the first conductivity type in the ion well at sides of the first or second gate finger opposite to the central lightly doped region; forming spacers on sidewalls of the first and second gate fingers; implanting a central heavily doped region of the second conductivity type into the ion well between the first and second gate fingers; and implanting, in a self-aligned fashion, sideward heavily doped regions of the first conductivity type into the sideward lightly doped regions.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

The present invention, which provides novel junction varactors for CMOS and BiCMOS technologies as well as a method for fabricating the same, will now be described in more detail by referring to the drawings that accompany the present application. It is to be understood that the conductivity types, device or circuit layout, or materials used as set forth in the following detailed description and figures are only for illustration purpose. The scope of this invention should be construed as limited only by the metes and bounds of the appended claims.

Figure 3:
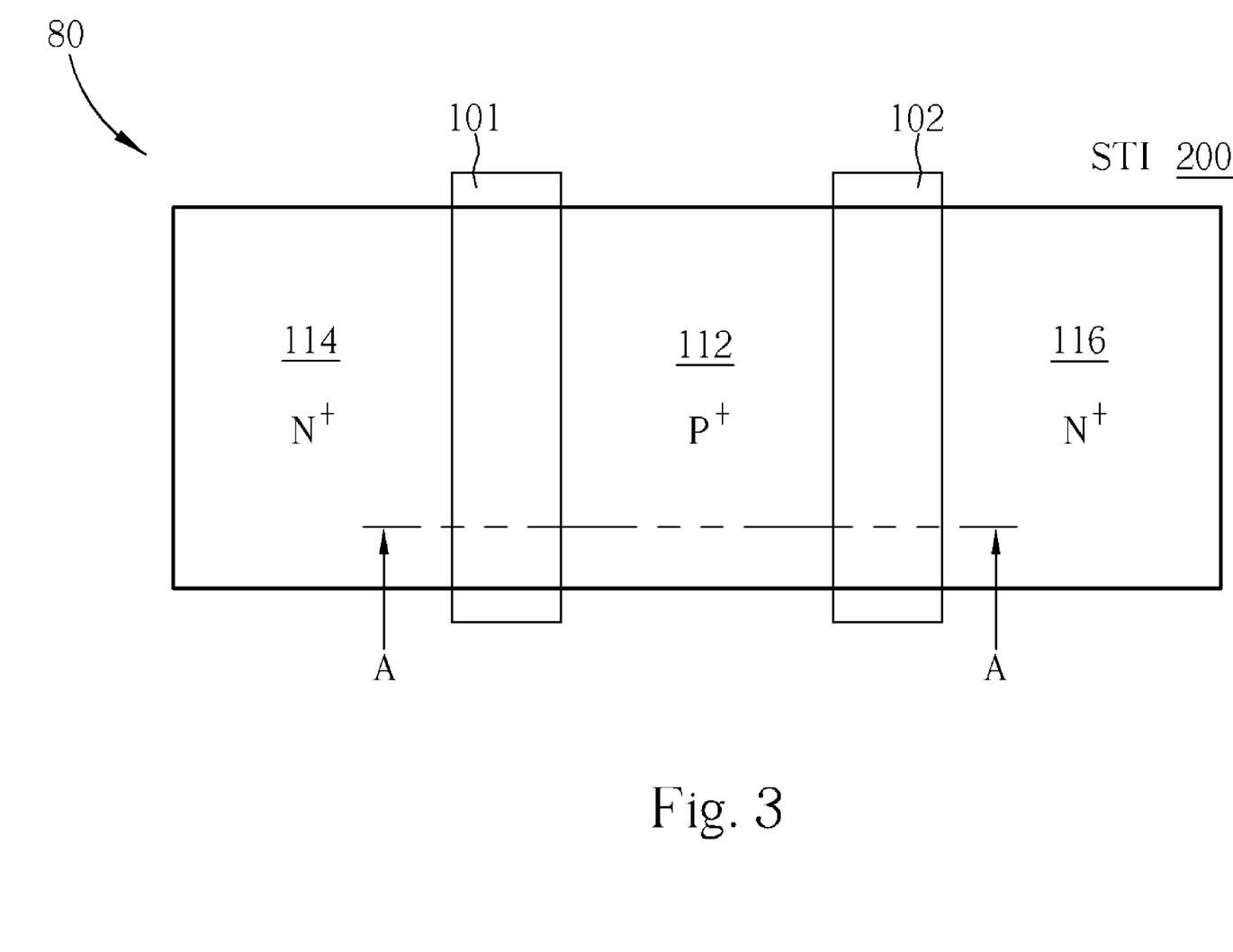
FIG. 3 is a schematic top view showing the layout of a junction varactor in accordance with one preferred embodiment of the present invention.
Figure 4:
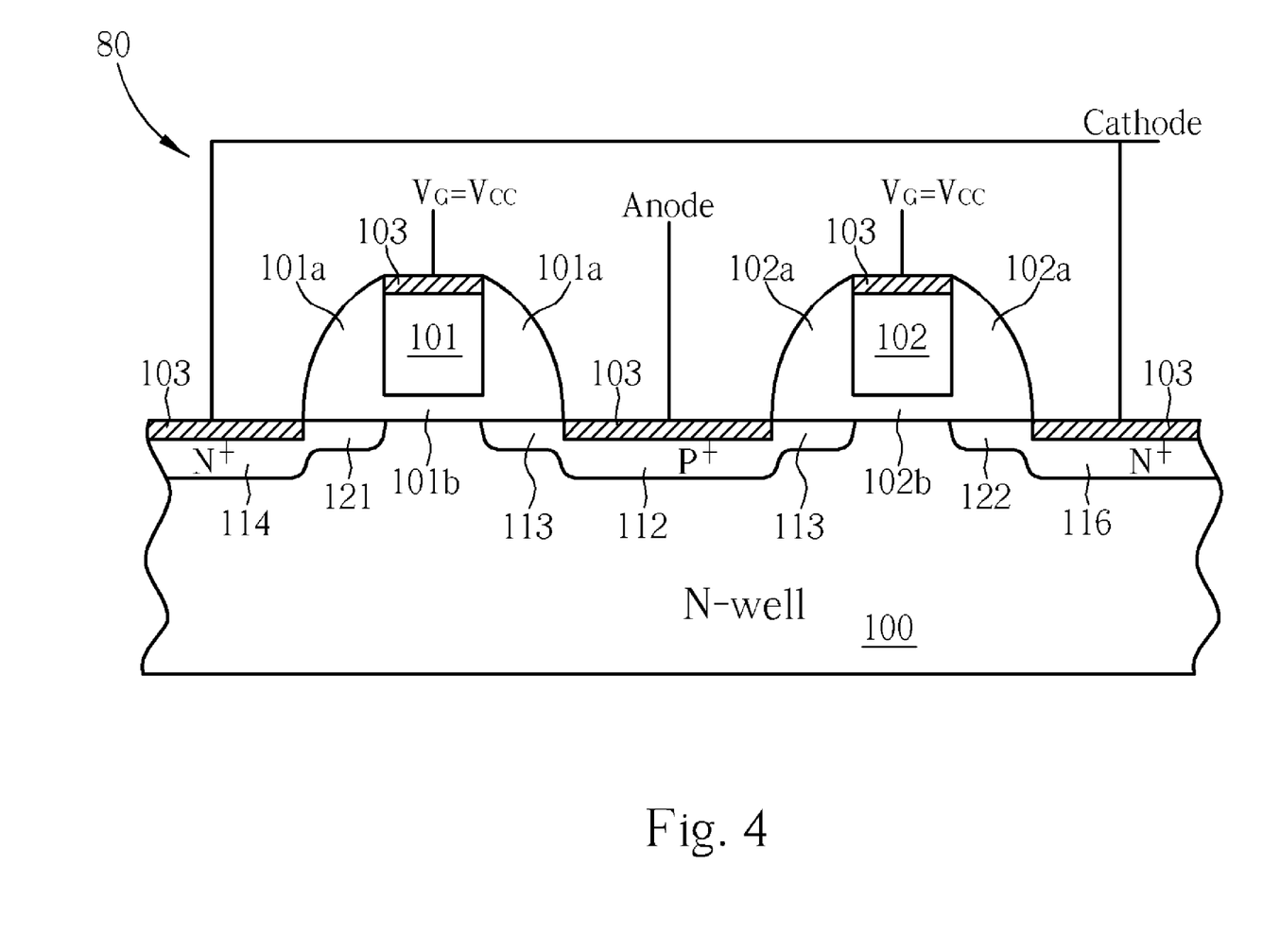
FIG. 4 is a schematic cross-sectional diagram showing the junction varactor along line AA of FIG. 3.

Referring initially to FIG. 3 and FIG. 4, wherein FIG. 3 is a schematic top view showing the basic layout of a junction varactor 80 in accordance with one preferred embodiment of the present invention; FIG. 4 is a schematic cross-sectional diagram showing the junction varactor 80 along line AA of FIG. 3. According to the preferred embodiment of the present invention, the junction varactor 80 is formed on an N-well 100, which may be formed on a commercially available P type silicon substrate or a silicon-on-insulator (SOI) substrate. The N-well 100 is electrically isolated by shallow trench isolation (STI) 200. In a case that the substrate is an SOI substrate, the STI 200 reaches down to a buried oxide layer and thus renders the N-well 100 in a floating status.

The junction varactor 80 further comprises an elongated gate finger 101 lying across the N-well 100, and a gate finger 102 situated at one side of the gate finger 101. As specifically indicated in FIG. 3, the gate finger 102, which overlies the N-well 100, is arranged substantially in parallel with the gate finger 101. Both of the gate finger 101 and gate finger 102 have vertical sidewalls, on which spacers 101a and 102a are formed. The gate finger 101 and gate finger 102 may be formed of polysilicon or metals. A gate dielectric layer 101b and a gate dielectric layer 102b are provided under the gate fingers 101 and 102, respectively. A P$^+$ doping region 112, which serves as an anode of the junction varactor 80, is formed in the N-well 100 between the gate fingers 101 and 102. Preferably, the P$^+$ doping region 112 is contiguous with P-type lightly doped drains (PLDD) 113 that extend laterally to under the spacers 101a and 102a.

As best seen in FIG. 4, in the N-well 100, at one side of the gate finger 101 that is opposite to the P$^+$ doping region 112, an N+ doping region 114 is provided. An N-type lightly doped drain (NLDD) 121 that is merged with the N$^+$ doping region 114 extends laterally to the gate 101. In the N-well 100, at one side of the gate finger 102 that is opposite to the P$^+$ doping region 112, an N$^+$ doping region 116 is provided. Likewise, an NLDD 122 that is merged with the N$^+$ doping region 116 extends laterally to the gate 102. The N$^+$ doping region 114 is electrically coupled to the N$^+$ doping region 116 by interconnection, and together serves as a cathode of the junction varactor 80. Furthermore, to reduce sheet resistance of the varactor 80, a salicide layer 103 is optionally provided on the exposed surface of the P$^+$ doping region 112, the N$^+$ doping region 114, and the N$^+$ doping region 116.

Compared with the prior art junction varactors, the present invention junction varactor has a lower resistance because there is no STI formed between the anode and cathode of the varactor. Therefore, the present invention junction varactor has a higher Q factor and better performance. In operation, the gate fingers 101 and 102 are preferably biased to a pre-selected voltage $V_G$. In the case as demonstrated in FIG. 3 and FIG. 4, the pre-selected voltage $V_G$ is a positive voltage such as $V_{CC}$. The positive voltage provided to gate fingers 101 and 102 results in accumulated electrons in the channel regions that are located under the gate fingers 101 and 102, thereby further reducing resistance of the varactor 80. By altering the bias between the anode and cathode of the junction varactor 80, the capacitance of the junction varactor may be tuned in an extended tuning range.

Figure 5:
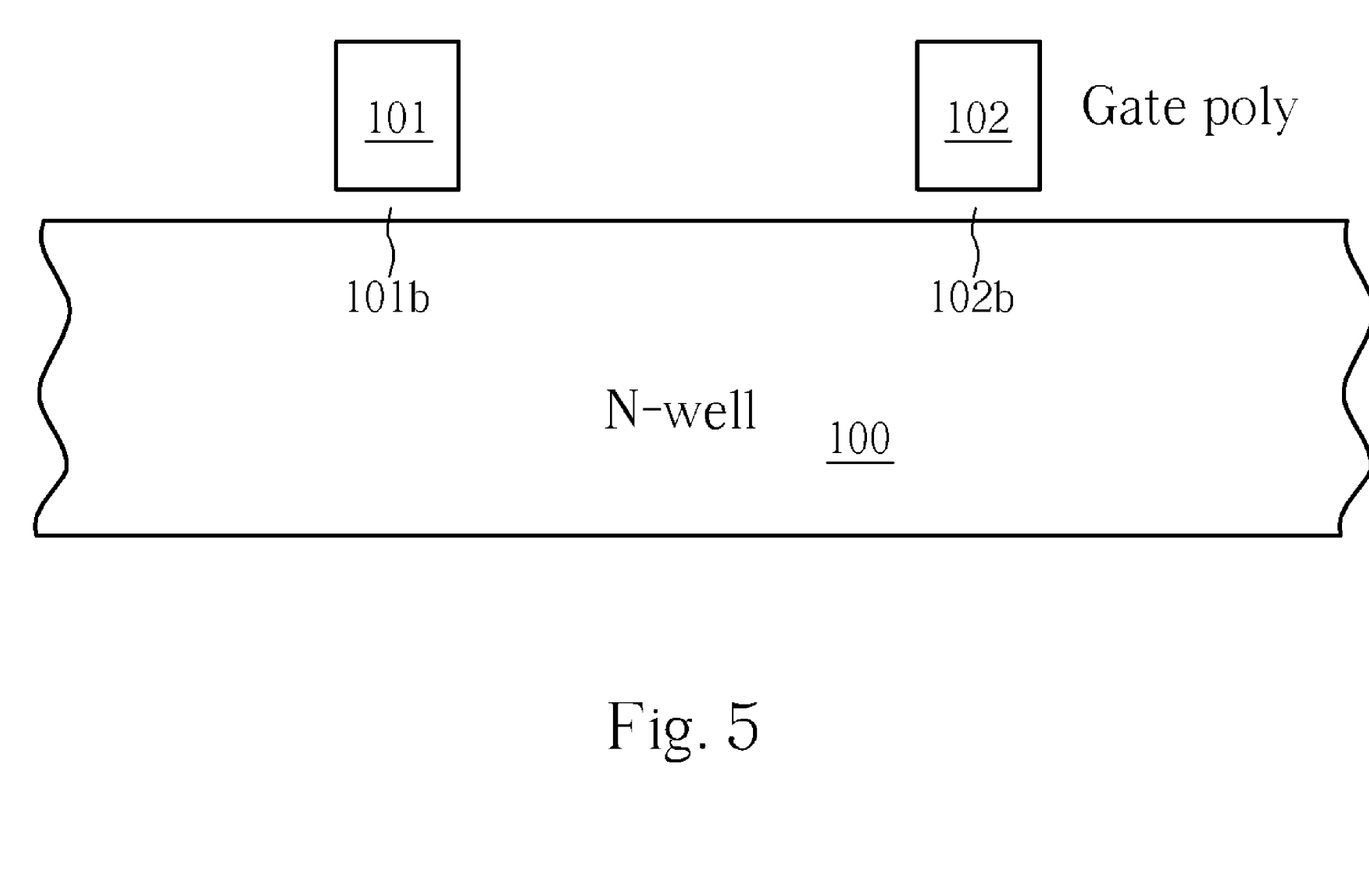
FIGS. 5-8 are schematic cross-sectional diagrams showing the process steps for making the junction varactor as set forth in FIG. 4 according to this invention.

Reference is now made to the embodiment illustrated in FIGS. 5-8 wherein the various processing steps employed in fabricating the inventive junction varactor are shown. The method for fabricating the inventive junction varactor in accordance with the preferred embodiment of this invention is CMOS compatible. FIG. 5 illustrates the first step used in forming the inventive junction varactor. As shown in FIG. 5, a substrate (not explicitly shown) is provided, on which an N-well 100 is formed by any method known in the art, for example, ion implantation. The N-well 100 is isolated by STI (not shown). Subsequently, an insulation layer (not explicitly shown) such as thermally grown gate oxide layer is formed on the surface of the N-well 100. A layer of polysilicon is deposited over the insulation layer, and then patterned to form gate structures 101 and 102 using conventional lithographic and dry etching processes. The deposition of the polysilicon layer may be fulfilled by conventional LPCVD. In another case, the gates may be made of metals.

Figure 6:
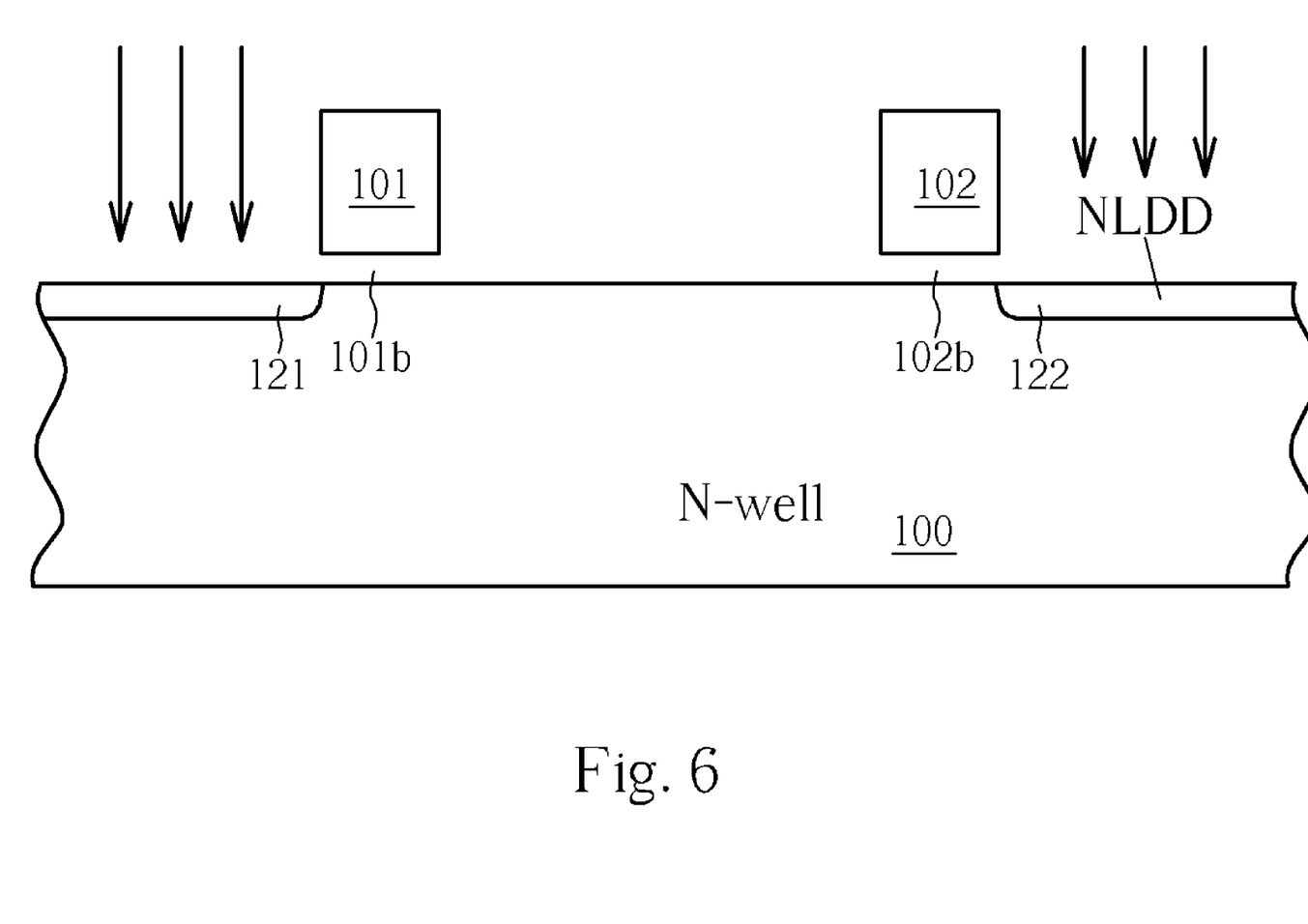

As shown in FIG. 6, using a suitable mask or an "NLDD implant photo" to mask the area between the gate 101 and the gate 102, an NLDD ion implantation process is carried out to dope ions such as arsenic into the N-well 100 at one side of the gate 101 and at one side of the gate 102, thereby forming an NLDD region 121 and NLDD region 122.

Figure 7:
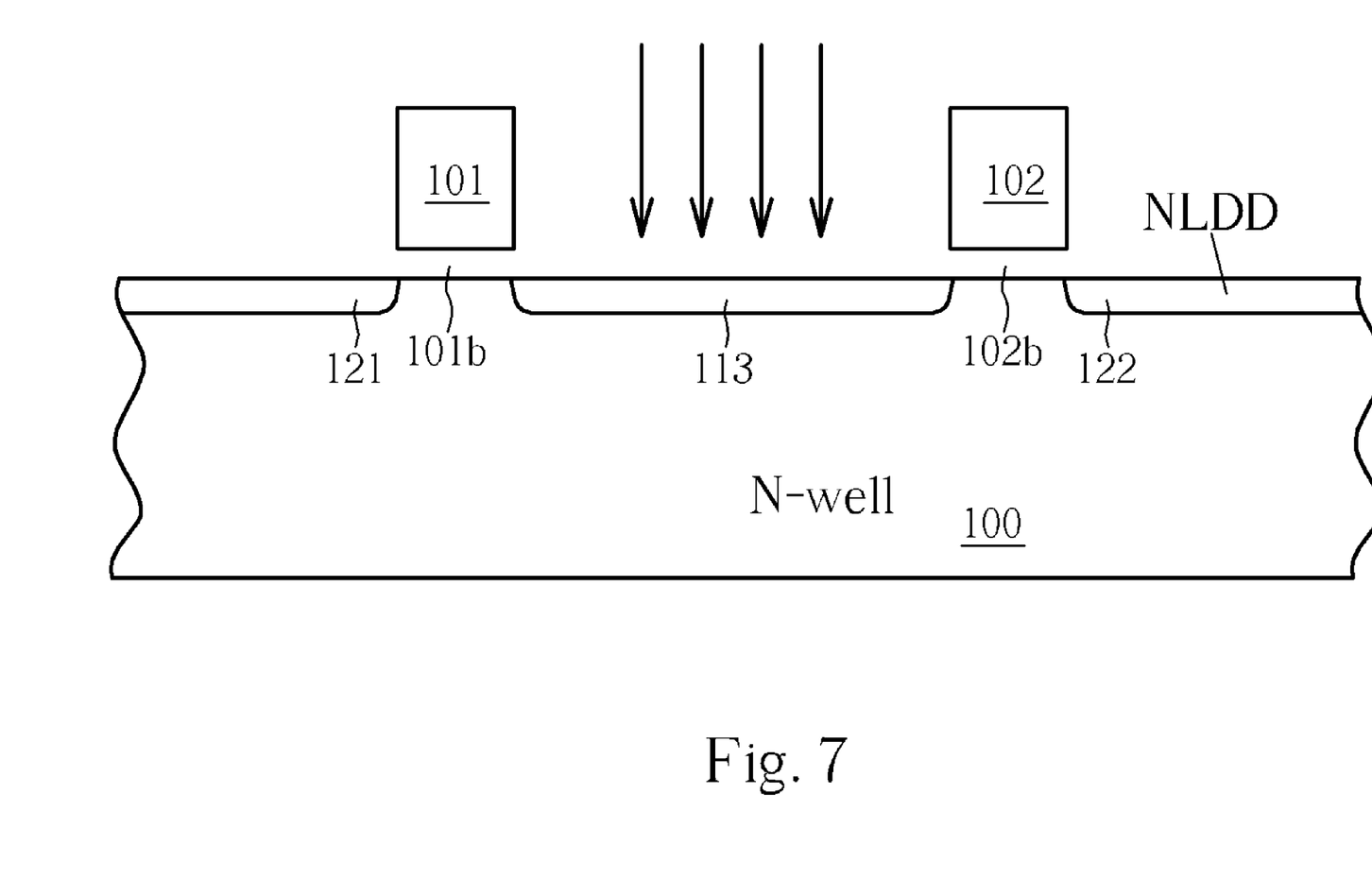

As shown in FIG. 7, using a suitable mask or a so-called "PLDD implant photo" to open the area between the gate 101 and the gate 102, a PLDD ion implantation process is carried out to dope ions such as boron into the N-well 100 in the area between the gate 101 and the gate 102, thereby forming a PLDD region 113.

Figure 8:
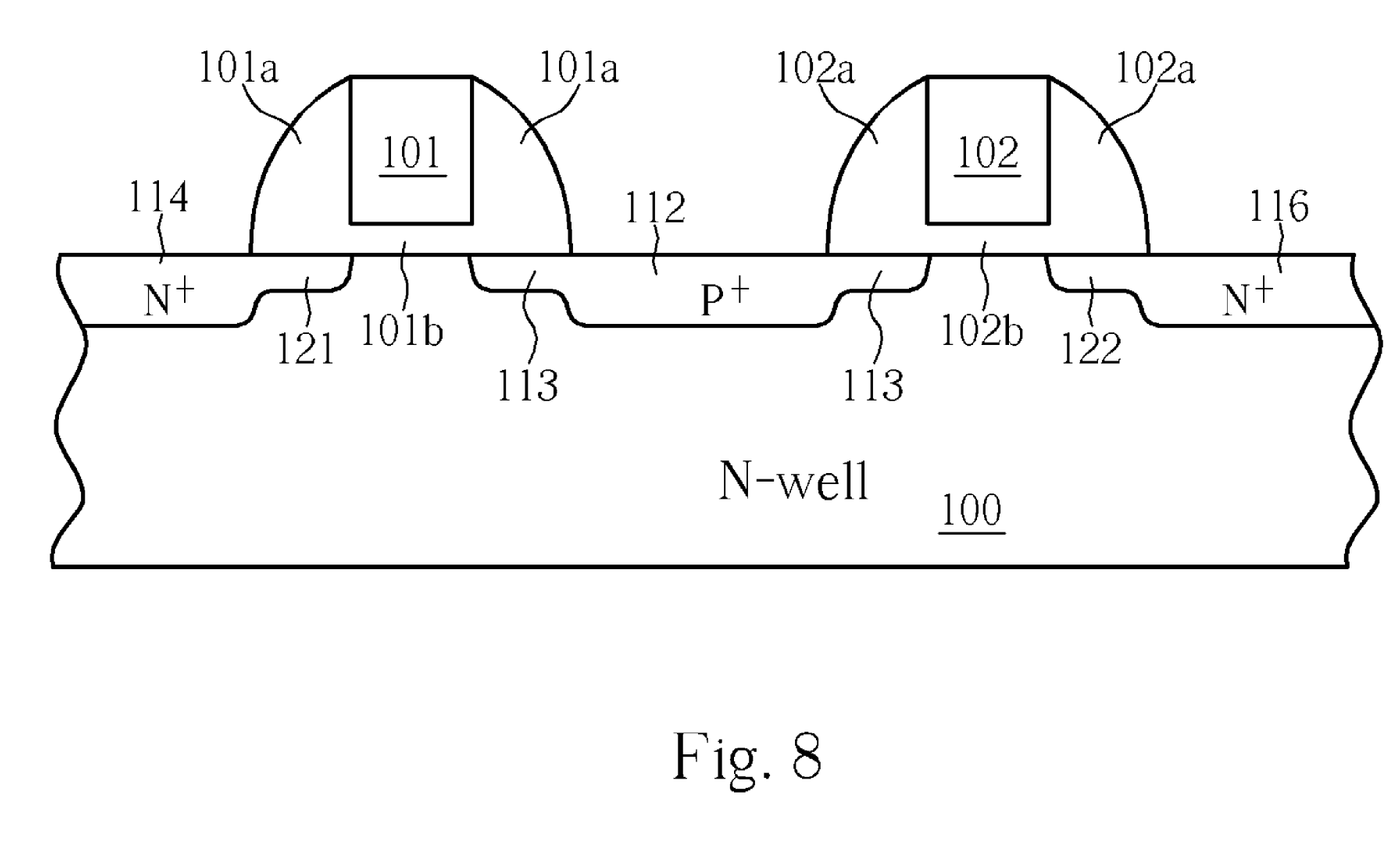

As shown in FIG. 8, using methods known in the art, spacers 101a and 102a are formed on sidewalls of the gates 101 and 102, respectively. Subsequently, using a suitable mask or so-called "N$^+$ implant photo" to mask the area between the gate 101 and the gate 102, an N$^+$ ion implantation process is carried out to dope a high dosage of ions such as arsenic into the N-well 100 at one side of the gate 101 and at one side of the gate 102, thereby forming N$^+$ region 114 and N$^+$ region 116. Finally, using the PLDD implant photo to expose the area between the gate 101 and the gate 102, a P$^+$ ion implantation is carried to form the P$^+$ doping region 112. After implementing a conventional self-aligned silicidation process, the junction varactor 80 as set forth in FIG. 4 is produced.

Figure 9:
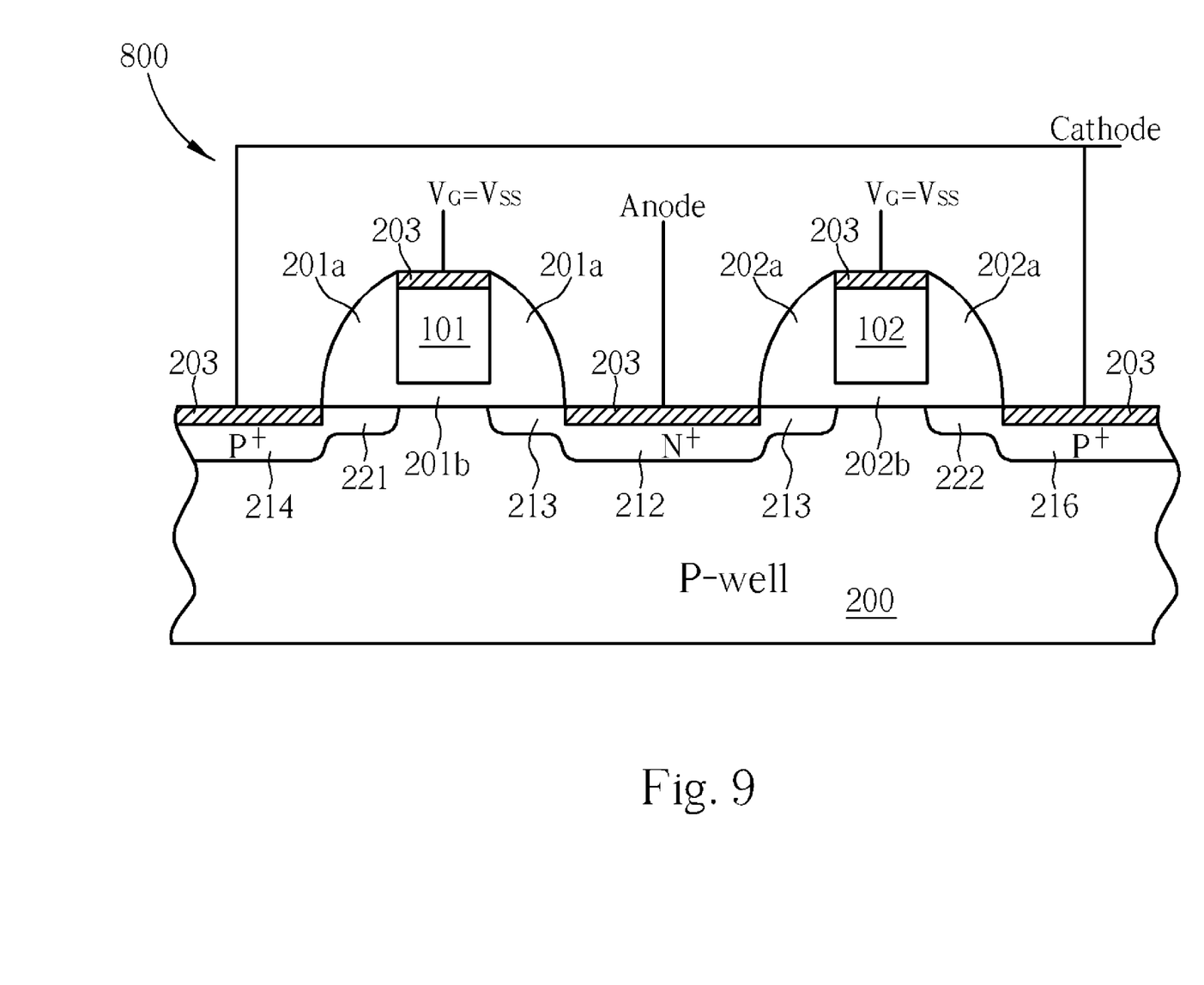
FIG. 9 is a schematic cross-sectional diagram showing a junction varactor according to another preferred embodiment of this invention.

FIG. 9 depicts a schematic cross-sectional view of junction varactor 800 according to another preferred embodiment of this invention. As shown in FIG. 9, the junction varactor 800 is formed on a P-well 200. The junction varactor 800 comprises an elongated gate finger 201 lying across the P-well 200, and a gate finger 202 situated at one side of the gate finger 201. The gate finger 202, which overlies the P-well 200, is arranged substantially in parallel with the gate finger 201. Both of the gate finger 201 and gate finger 202 have vertical sidewalls, on which spacers 201a and 202a are formed. The gate finger 201 and gate finger 202 may be formed of polysilicon or metals. A gate dielectric layer 201b and a gate dielectric layer 202b are provided under the gate fingers 201 and 202, respectively. An N$^+$ doping region 212, which serves as an anode of the junction varactor 800, is formed in the P-well 200 between the gate fingers 201 and 202. Preferably, the N$^+$ doping region 212 is contiguous with N-type lightly doped drains (NLDD) 213 that extend laterally to under the spacers 201a and 202a.

In the P-well 100, at one side of the gate finger 201 that is opposite to the N⁺ doping region 212, a P⁺ doping region 214 is provided. A P-type lightly doped drain (PLDD) 221 that is merged with the P⁺ doping region 214 extends laterally to the gate 201. At one side of the gate finger 202 that is opposite to the P⁺ doping region 212, a N⁺ doping region 216 is provided in the P-well 200. Likewise, a PLDD 222 that is merged with the P⁺ doping region 216 extends laterally to the gate 202. The P⁺ doping region 214 is electrically coupled to the P⁺ doping region 216 by interconnection, and together serves as a cathode of the junction varactor 800. Likewise, to reduce sheet resistance of the varactor 800, a salicide layer 203 is optionally provided on the exposed surface of the N⁺ doping region 212, the P⁺ doping region 214, and the P⁺ doping region 216. In operation, the gate fingers 201 and 202 are preferably biased to a pre-selected voltage $V_G$. By way of example, in the case as demonstrated in FIG. 9, the pre-selected voltage $V_G$ is $V_{SS}$. By altering the bias between the anode and cathode of the junction varactor 800, the capacitance of the junction varactor may be tuned in an extended tuning range.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating a junction varactor, comprising:

providing a substrate having thereon an ion well of first conductivity type;

forming first and second gate fingers across said ion well, wherein said first and second gate fingers are substantially parallel to one another;

forming a central lightly doped region of a second conductivity type in said ion well between said first and second gate fingers;

forming sideward lightly doped regions of said first conductivity type in said ion well at sides of said first or second gate finger opposite to said central lightly doped region;

forming spacers on sidewalls of said first and second gate fingers;

implanting a central heavily doped region of said second conductivity type into said ion well between said first and second gate fingers; and implanting, in a self-aligned fashion, sideward heavily doped regions of said first conductivity type into said sideward lightly doped regions.

2. The method according to claim 1 wherein said first conductivity type is N type and said second conductivity type is P type.

3. The method according to claim 1 wherein said first conductivity type is P type and said second conductivity type is N type.

4. The method according to claim 1 wherein said first gate finger is insulated from said substrate with a first gate dielectric layer and said second gate finger is insulated from said substrate with a second gate dielectric layer.

5. The method according to claim 1 further comprising forming silicide layers on said first and second gate fingers and on said central and sideward heavily doped regions.

6. The method according to claim 1 wherein said central heavily doped region functions as an anode of said junction varactor.

7. The method according to claim 1 wherein said sideward heavily doped regions are coupled together and function as a cathode of said junction varactor.

8. The method according to claim 1 wherein said first and second gate fingers are connected to a Vcc or Vss voltage signal.

* * * * *